United States Patent [19]

Komuro et al.

[11] Patent Number: 5,229,621

[45] Date of Patent: Jul. 20, 1993

[54] MAGNETIC SEMICONDUCTOR ELEMENT AND A MAGNETO-OPTICAL READ OUT HEAD

[75] Inventors: Matahiro Komuro, Hitachi; Yuzo Kozono, Hitachiota; Masanobu Hanazono, Mito, all of Japan

[73] Assignee: Hitachi, Ltd., Tokyo, Japan

[21] Appl. No.: 888,422

[22] Filed: May 26, 1992

Related U.S. Application Data

[63] Continuation of Ser. No. 614,090, Nov. 15, 1990.

[30] Foreign Application Priority Data

Nov. 15, 1989 [JP] Japan .................................. 1-296685

[51] Int. Cl.$^5$ ............................................. H01L 27/22
[52] U.S. Cl. ............................................. 257/13; 257/21; 257/43; 257/425; 372/49; 372/46; 360/113; 365/157
[58] Field of Search ............. 357/25, 27, 16, 26, 357/17; 372/49, 43, 46, 45; 360/125, 113, 135, 126, 127; 365/105, 114, 115, 158, 157

[56] References Cited

U.S. PATENT DOCUMENTS

| 3,676,795 | 7/1972 | Prah, Jr. ......................... 357/27 X |
| 3,986,194 | 10/1976 | Masumoto et al. ............... 357/27 X |
| 4,499,515 | 2/1985 | Piotrowski et al. .............. 357/27 X |

OTHER PUBLICATIONS

Burke, Handbook of Magnetic Phenomena, 1986, pp. 264-265, Van Nostrand Reinhold Company, New York.

*Primary Examiner*—William Mintel
*Attorney, Agent, or Firm*—Antonelli, Terry, Stout & Kraus

[57] ABSTRACT

A magnetic semiconductor element formed by joining a magnetostrictive material and a semiconductive material with each other, in which the lattice constant of the semiconductive material is variable by magnetostriction at the interface therebetween; or in which an interface between the two materials is formed by epitaxial growth and the orientation of the magnetostriction is identical to the orientation in which the lattice constant of the semiconductive material varies. Next, a semiconductor laser is so constructed that the interface between the magnetostrictive material and the semiconductive material is disposed in the semiconductor laser and the wavelength and the output of the semiconductor laser are variable by magnetostriction. Further, a method of making a magnetic semiconductor element comprises a step of epitaxially growing the layer of the magnetostrictive material on the layer made of the semiconductive material. Furthermore, a magneto-optical read out head is so constructed that the interface formed by joining the magnetostrictive material and the semiconductive material with each other is disposed in the semiconductor laser constituting a head reading out information recorded in a magnetic recording medium.

24 Claims, 5 Drawing Sheets

MAGNETIC SEMICONDUCTOR ELEMENT AND A MAGNETO-OPTICAL READ OUT HEAD

This application is a continuation of application Ser. No. 07/614,090, filed on Nov. 15, 1990.

BACKGROUND OF THE INVENTION

The present invention relates to a magnetic semiconductor element capable of varying optical and electric characteristics of a semiconductor by magnetostriction of a magnetic body, and a method of making the same, as well as a magneto-optical read-out head using the element.

Heretofore it is discussed in the *Handbook of Magnetic Phenomena*, Van Nostrand Reinhold Company, 1986, pp. 264-265 to vary the voltage between a magnetostrictive material and a piezo-electric material by forming an interface between a magnetic body and the piezo-electric material and giving the piezo-electric material a stress by magnetostriction.

According to the prior art technique described above, the interface was formed between the magnetostrictive material and the piezo-electric material, only the voltage between the magnetostrictive material and the piezo-electric material was varied, and no attention was paid to the fact that optical characteristics of a semiconductor are varied by magnetostriction. Therefore application thereof to magneto-optical heads was impossible.

Further nothing was described on the point that the interatomic distance in the semiconductor is varied through the interface by the magnetostrictive material, and it was not an element in which electric characteristics or optical characteristics of only the semiconductor are varied by magnetostriction.

SUMMARY OF THE INVENTION

An object of the present invention is to provide a magneto-electric and magneto-optical converting element, in which electric characteristics and optical characteristics of a semiconductor itself are varied reversibly by varying the interatomic distance in the semiconductor by magnetostriction through the interface between a magnetostrictive material and the semiconductor.

Another object of the present invention is to provide a method of making the interface by utilizing epitaxial growth and superposing the materials described above under influences of the atomic alignment in an underlayer, and the application of an element thus fabricated to a semiconductor laser and a magneto-optical read-out head.

In order to achieve the above objects, in a magnetic semiconductor element according to the present invention a magnetoresistive material and a semiconductive material are joined with each other and it is so formed that the lattice constant of the semiconductive material is variable at the interface therebetween by magnetostriction.

Further, in the magnetic semiconductor element according to the present invention, in which the magnetostrictive material and the semiconductive material are joined with each other, the interface between the two materials described above is formed by the epitaxial growth and the orientation of the magnetostriction is identical to the orientation, in which the lattice constant in the semiconductive material varies.

Still further, in the magnetic semiconductor element the magnetostrictive material and the semiconductive material are joined with each other and it is so formed that the specific resistance of the semiconductive material is variable by the magnetostriction at the interface. Here the magnetostrictive material is preferably oxide containing at least one element in the group consisting of Fe, Co and Ni. Furthermore the amount of variation in the lattice constant of the semiconductive material is preferably greater than 0.01%. It is desirable that it is 10% at maximum.

Next, a semiconductor laser according to the present invention is formed by disposing the interface described above between the magnetostrictive material and the semiconductive material in the semiconductor laser so that the wavelength and the output of the semiconductor laser can be varied by the magnetostriction. Here it is preferably a wavelength modulation semiconductor laser, for which the absolute value of the magnetostriction constant of the magnetostrictive material is greater than $1 \times 10^{-5}$.

Now a method of making the magnetic semiconductor element according to the present invention comprises a step of making a layer of the magnetostrictive material epitaxially grown on the semiconductor layer to form a junction and form an interface, at which interface the lattice constant in the semiconductive material is variable by magnetostriction. Here the layer of the magnetostrictive material is formed at first by depositing a monocrystal metal film including no oxygen on the layer of the semiconductive material by evaporation and then by transforming the monocrystal metal film stated above into oxide by oxidizing it. Or the epitaxial growth of the magnetostrictive material is effected preferably while injecting oxygen ions therein.

Next, in the magneto-optical read out head according to the present invention an interface formed by joining the magnetostrictive material with the semiconductive material, at which the lattice constant in the semiconductor is variable by the magnetostriction, is disposed in a semiconductor laser constituting a head reading out information recorded in a magnetic recording medium.

According to the present invention, an interface is formed, in which variations in the interatomic distance in the magnetic material due to the magnetostriction can correspond to variations in the interatomic distance in the semiconductor.

Consequently, for the material forming the interface together with the semiconductor a material having a magnetostriction, which is not 0, is necessary. As far as the interatomic distance at the interface is reversible, the optical characteristics of the semiconductor can be more strongly varied with increasing magnetostriction constant. It is the band gap that determines the electric and optical characteristics of the semiconductor. Heretofore, in order to vary the band gap of the semiconductor, it was necessary to change the composition of the semiconductor and the band gap is determined by the composition and the impurity concentration. On the contrary, it is possible to vary reversibly the interatomic distance in the semiconductor, i.e. the lattice constant, by forming the interface described above on a part of the semiconductor. The variations in the interatomic distance or the lattice constant vary the band gap and this makes it possible to vary the electric and optical characteristics of the semiconductor.

The band gap of the semiconductor material of the semiconductor laser indicated in FIG. 8 is determined by the composition of the semiconductor. Further, for varying the band gap, heretofore it was necessary to change the composition of the semiconductor. When the composition of the semiconductor is changed, the lattice constant varies and the band gap changes.

The lattice in the magnetic material is deformed for materials, for which the magnetostriction is not zero, by applying a magnetic field thereto. The amount of variations in the lattice, when a certain magnetic field is applied thereto, is greater with a material having a greater magnetostriction. When an interface is formed between a semiconductor and such a magnetostrictive material, the lattice deformation of the magnetostrictive material deforms the lattice of the semiconductor and in this way it is possible to vary the band gap of the semiconductor.

Further, when the magnetostriction varies the band gap of the semiconductor through the interface described above, the structure of the interface is important. That is, defects, dislocation, lattice distortion, etc. in the neighborhood of the interface described above have influences on variations in the band gap of the semiconductor due to the magnetostriction. Therefore, in order that the structure in the neighborhood of the interface has an atomic alignment having few defects, it is formed preferably by epitaxial growth.

That is, in the case where the band gap of the semiconductor is controlled by magnetostriction, the most important factor is the structure between the semiconductor and the magnetostrictive material. Since the value of the magnetostriction varies, depending on the crystallographical orientation of the magnetic material, in order that the effect of the magnetostriction is great, it is preferable that the crystallographical orientation, in which the value of the magnetostriction constant is great, is in accordance with the orientation, in which the lattice deformation of the semiconductor is produced. Further, if there exist defects such as dislocation, lattice defects, etc. in the neighborhood of the interface described above, the amount of the lattice deformation of the semiconductor due to the magnetostriction is smaller than that observed in the case where there exist no defects. In order to fabricate a material, in which the crystallographical orientation having no defects is constant on the whole interface, it is useful to utilize the epitaxial growth. In order to realize the epitaxial growth, concerning the selection of the material, it is necessary that the difference in the face interval between the material to be grown and the material of the substrate (underlayer) is small. With this respect, a combination of $Fe_3O_4$ known as a magnetostrictive material and GaAs is a material, by means of which the epitaxial growth is possible. The reason therefor is that the lattice constant of $Fe_3O_4$ is 8.396 Å while the face interval of GaAs (110) is 7.99 Å, i.e., the difference in the face interval is as small as 5%. Further, $Fe_3O_4$ is stable from the energetic point of view; variations in the magnetic characteristics with the passage of time are small; and a film thereof is stable from the structural point of view. Since ferrite, whose base is $Fe_3O_4$, can be considered almost as an insulator, even if a ferrite layer is used in a part of the interface of the semiconductor laser, it is possible to form the interface between the ferrite and semiconductor without changing electric characteristics of the element.

By utilizing the epitaxial growth, it is possible to introduce a layer made of a magnetostrictive material in the semiconductor laser without changing the structure of the element and in this way to vary the light wavelength and the light output of the semiconductor laser by the magnetostriction.

DESCRIPTION OF PREFERRED EMBODIMENT

The outline of the construction of the principal part of a magnetic semiconductor element according to the present invention will be explained. Here a construction, in which a semiconductor layer 101 is sandwiched by magnetostrictive material layers 102, is cited as an example. Thus constructed, the lattice of the semiconductor 101 is deformed by magnetostriction around the neighborhood of the interfaces between the semiconductor 101 and the magnetostrictive material layers 102. The value of the band gap of the semiconductor, in which a deformed lattice exists, changes from that observed for the semiconductor, in which no deformation exists.

Figure 8:
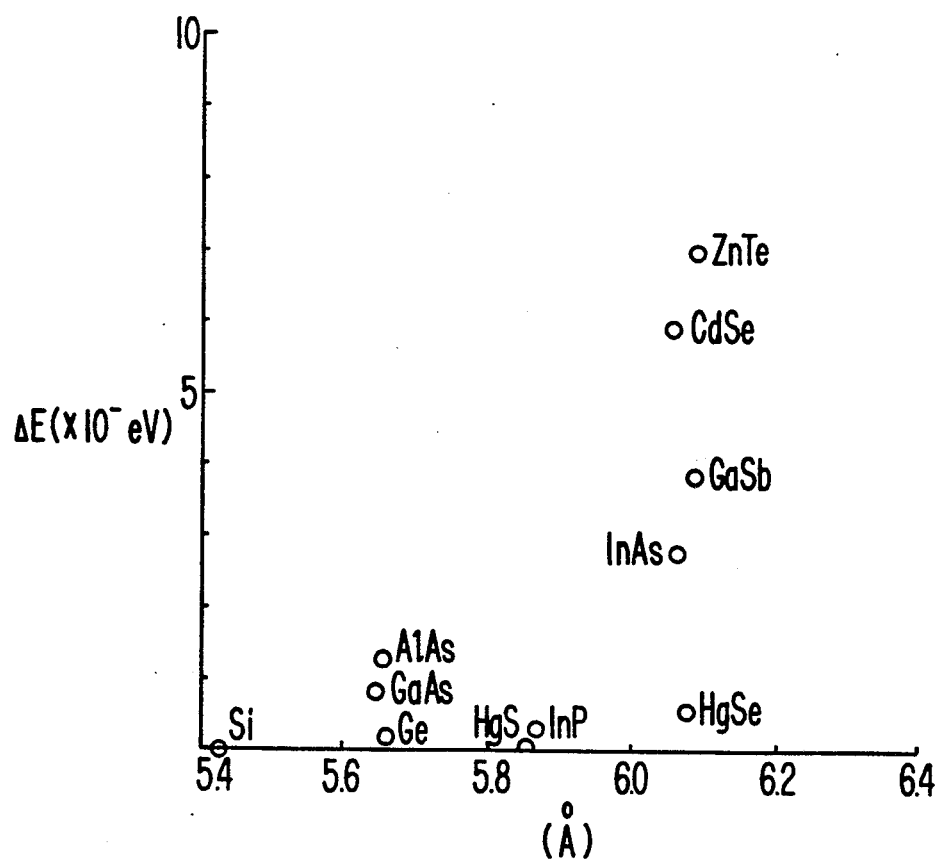
FIG. 8 is a diagram indicating the relation between the lattice constant and the amount of variation in the band gap.

FIG. 8 shows the relation between the amount of variation $\Delta E$ in the band gap and the lattice constant of the semiconductor measured in a magnetic field of 1 kOe for an interface between $CoFe_2O_4$ and the semiconductor fabricated by evaporation. Although the structure of $CoFe_2O_4$ grown on a semiconductor varies, depending on the temperature of the substrate, the speed of the evaporation, and the partial pressure of $O_2$, measurement was effected by using an epitaxially grown $CoFe_2O_4$ film. The $CoFe_2O_4$ film and the semiconductor was 20 μm thick. From FIG. 8, it can be seen that $\Delta E$ is great for compound semiconductors having lattice constants in a region of 6.0 to 6.1. It can be thought that this is due to the fact that for the semiconductors having lattice constants of 6.0 to 6.1 the (110) interfacial distance is 8.5 to 8.6 Å, which is close to the lattice constant of $CoFe_2O_4$, and therefore $CoFe_2O_4$ can be easily epitaxially grown. In the case of ZnTe, $\Delta E$ is 0.70 eV and the dependence on the orientation of the magnetic field was recognized is $\Delta E$ for all the films epitaxially grown. That is, $\Delta E$ is greatest, when a magnetic field is applied to [100] of $CoFe_2O_4$. When the angle of the magnetic field is varied in the plane with respect to $\Delta E$ by 360°, $\Delta E$ is symmetric 4 times. Although InAs and HgSe have lattice constants almost equal to that of ZnTe, $\Delta E$ therefor is smaller than that obtained for ZnTe. It can be thought that this is due to the fact that Co and Fe react with the semiconductors at the interface between $CoFe_2O_4$ and them. Ferrites other than $CoFe_2O_4$ have been grown epitaxially on ZnTe giving the greatest $\Delta E$ and $\Delta E$ has been obtained therefor. Results thus obtained are indicated in TABLE 1. The values of $\Delta E$ indicated in TABLE 1 are obtained in the case where a magnetic field of 1 kOe is applied to the ferrite in the direction of [100]. From TABLE 1 it was understood that the value of $\Delta E$ depends on the absolute value of the magnetostriction $\lambda$ and that $\Delta E$ increases with increasing $\lambda$.

TABLE 1

| Ferrite | $\Delta E$ |
| --- | --- |
| $MnFe_2O_4$ | 0.02 |
| $Co_{0.8}Fe_{2.2}O_4$ | 0.34 |
| $Co_{0.63}Mn_{0.4}Fe_2O_4$ | 0.25 |
| $Co_{0.1}Ni_{0.3}Fe_2O_4$ | 0.17 |
| $Ni_{0.8}Fe_{2.2}O_4$ | 0.09 |
| $Li_{0.43}Zn_{0.14}Fe_{2.07}O_4$ | 0.08 |
| $CuFe_2O_4$ | 0.13 |

Figure 1:
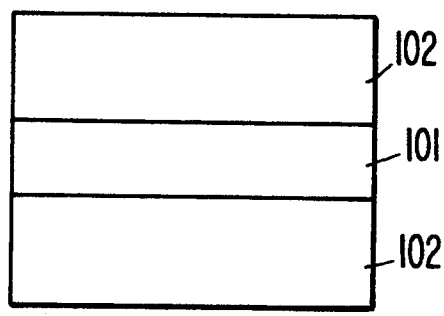
FIG. 1 is a scheme showing the construction of the principal part of a magnetic semiconductor element according to the present invention.
Figure 2:
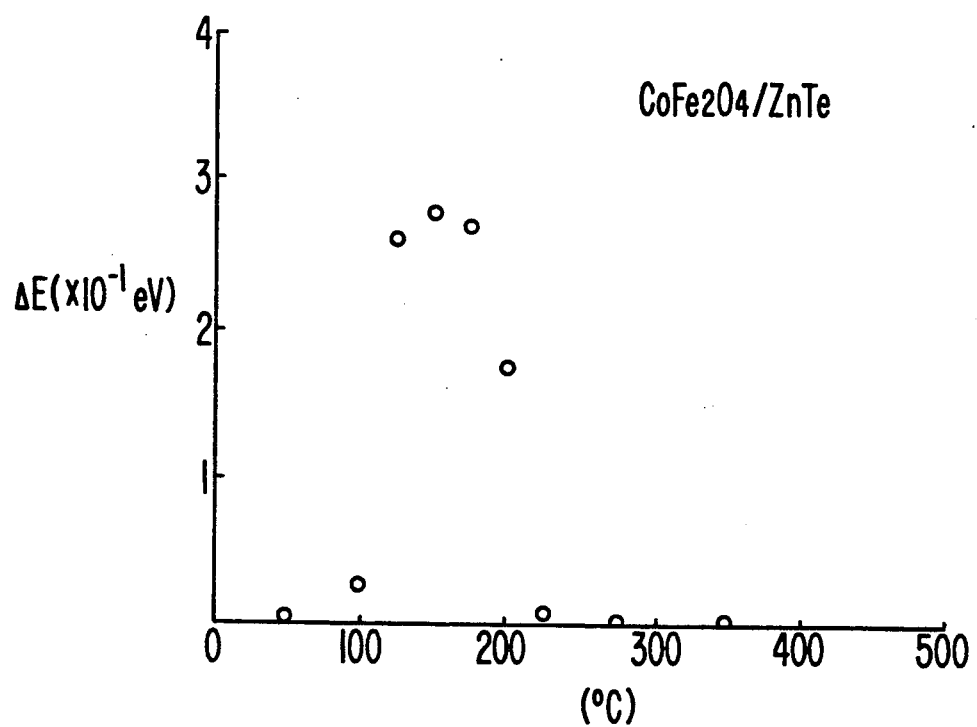
FIG. 2 is a diagram indicating the relation between the temperature of a substrate of $CoFe_2O_4/ZnTe$ and the amount of variation in the band gap.

FIG. 2 indicates the amount of variation $\Delta E$ in the band gap for films of $CoFe_2O_4$ 20 $\mu$m thick formed on a ZnTe (100) substrate by means of an evaporation apparatus while varying the temperature of the substrate. Other film forming conditions are indicated in TABLE 2.

TABLE 2

| Evaporation speed | <100 Å/s |
| --- | --- |
| Attained degree of vacuum | $<5 \times 100^{-9}$ Torr |
| Partial pressure of oxygen (during evaporation) | $1 \times 10^{-2}$ Torr |

Figure 9:
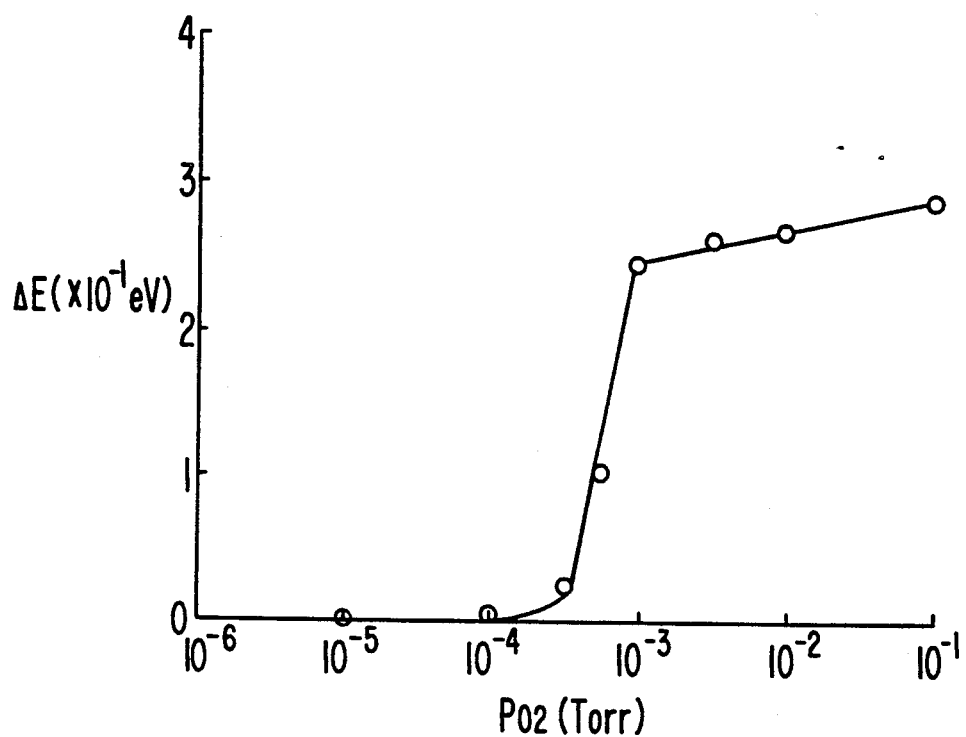
FIG. 9 is a graph indicating the relation between the partial pressure of oxygen and the amount of variation in the band gap.

The ZnTe (100) substrate was etched before the evaporation and the ZnTe surface was cleaned in the evaporation chamber. The structure of the surface was evaluated by means of the reflected high energy electron beam diffraction (RHEED). The $CoFe_2O_4$ film was epitaxially grown at a substrate temperature of 150° C. When the temperature was higher than 150° C., the film reacted with the substrate, and in the case where the temperature was lower than 150° C., the film was polycrystalline. It can be understood that $\Delta E$ is the greatest for the films epitaxially grown, as indicated in FIG. 2, and sensitive to the structure of the interface. That is, it can be thought that $\Delta E$ is small for polycrystalline, because atoms don't correspond 1 to 1 at the interface between the magnetic material and the semiconductor; various sorts of defects are introduced; and it is difficult to apply the magnetic field to the direction, in which the magnetostriction constant is greatest. Apart from the method, by which $CoFe_2O_4$ is epitaxially grown directly during the evaporation, another method is possible, by which at first a film containing no oxygen is deposited on a semiconductor substrate by evporation and then evaporation is effected in an oxygen atmosphere. This method is useful, when the semiconductor and the metal are evaporated in a same chamber and heat treatment in oxygen is effected in another chamber, in the case where a number of interfaces between the magnetic material and the semiconductor is formed in an element. FIG. 9 indicates the relation between $\Delta E$ and $P_{O2}$, after a $CoFe_2$ film 20 $\mu$m thick deposited by evaporation without introducing any oxygen in TABLE 2 was subjected to a 10 hr heat treatment at 500° C. with different partial pressures of oxygen ($P_{O2}$). When $P_{O2}$ is greater than $10^{-4}$, $\Delta E$ can be detected. At this time, $CoFe_2O_4$ is epitaxially grown for all the films. It can be thought that when $P_{O2}$ is smaller than $10^{-4}$, $\Delta E$ cannot be detected, because many oxygen defects exist in $CoFe_2O_4$ for low $P_{O2}$ and therefore $\lambda$ of $CoFe_2O_4$ is small.

Figure 6:
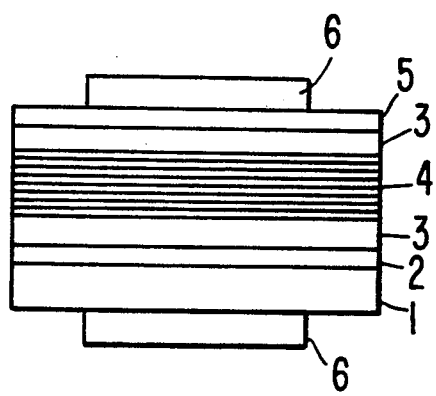
FIG. 6 is a scheme showing the construction of an InAs semiconductor laser element.

FIG. 6 shows the element structure of an InAs semiconductor laser capable of being modulated by means of a magnetic field. An n type InAs layer (1 $\mu$m thick) 2 is grown epitaxially on an InAs substrate (100) 1 20 $\mu$m thick by using an MBE apparatus and then a magnetostrictive material layer 3 is grown on the n type InAs layer 2. An InAS quantum well layer 4 is disposed on the magnetostrictive material layer 3 by epitaxial growth. In this way it is possible to vary the band gap to vary the wavelength of laser light by deforming the lattice of the quantum well layer by magnetostriction. Another magnetostrictive material layer 3 is grown epitaxially further on the quantum well layer 4 and a p type InAs layer 5 is disposed on the outer side of the other magnetostrictive material layer 3. Electrons are injected in the InAs quantum well layer 4 by applying a voltage to ohmic electrodes 6 and thus a photocurrent can be detected. The intensity of the photocurrent can be varied by applying a magnetic field to the element indicated in FIG. 6.

Figure 3:
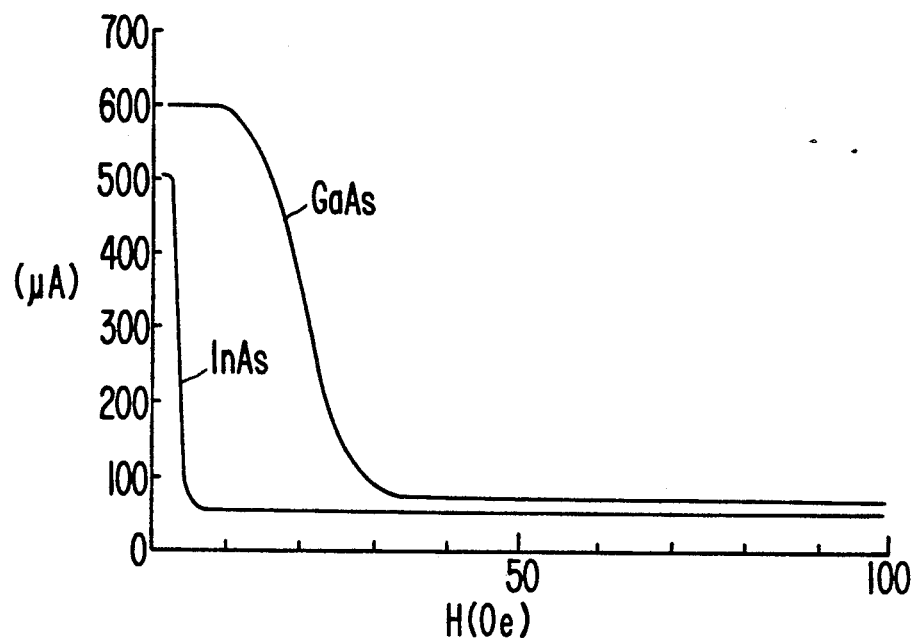
FIG. 3 is a graph indicating the relation between the magnetic field and the photocurrent for the element indicated in FIG. 6.

FIG. 3 indicates the relation between the photocurrent thus detected and the magnetic field H, when a magnetic field is applied parallel to the interfaces between the magnetostrictive layers 3 and the quantum well layer 4 in the element indicated in FIG. 6. The relation between the photocurrent and H when the parts made of InAs are replaced by GaAs is also indicated in FIG. 3. The magnetostrictive material is $Co_{0.8}Fe_{2.2}O_4$ and the layers made thereof are monocrystal films. In the case of InAs, the photocurrent decreases rapidly at a magnetic field of 3 Oe and the value of the photocurrent does almost not vary over 8 Oe. In the case of GaAs, the photocurrent begins to decrease gradually over 10 Oe and it is almost constant for the magnetic fields above 35 Oe. It can be thought that the photocurrent shows a dependency on the magnetic field, as indicated in FIG. 3, because the lattice is deformed by stress applied to the quantum well layer 4 due to the magnetostriction and the quantum well type band structure is deformed, which decreases the photocurrent.

Figure 4:
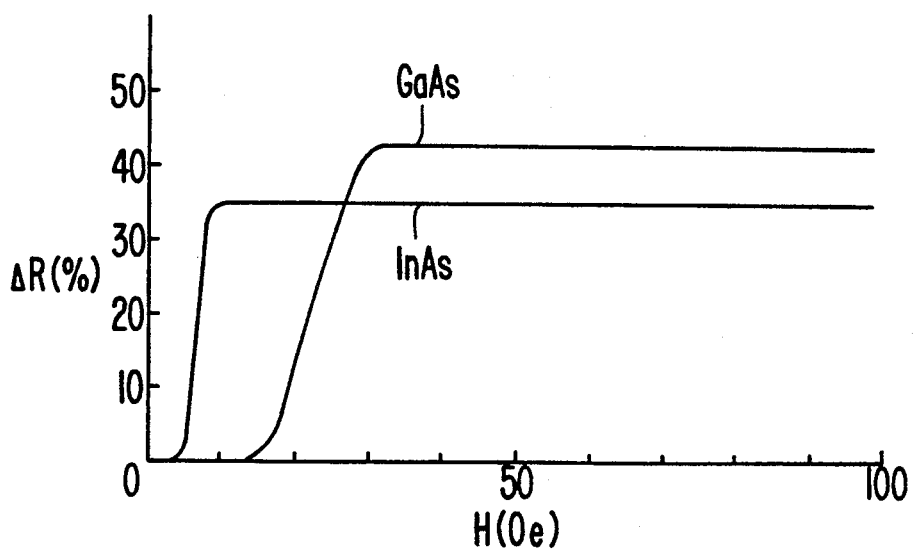
FIG. 4 is a graph indicating the relation between the magnetic field and the amount of variation in the specific resistance between ohmic electrodes for the element indicated in FIG..6.

FIG. 4 indicates variations $\Delta R$ in the specific resistance between the ohmic electrodes 6 measured for an element identical to that used for the measurement indicated in FIG. 3, when the magnetic field H is applied thereto and when no magnetic field is applied. In the case of InAs, $\Delta R$ begins to be produced at 3 Oe and it is saturated over 10 Oe. On the other hand, in the case of GaAs, the specific resistance varies at about 10 Oe and $\Delta R$ increases up to 32 Oe. When it is compared with FIG. 3, the dependency of the photocurrent and that of the specific resistance on the magnetic field are analogous and it can be though that the photocurrent and the specific resistance vary as a result of the lattice deformation due to the magnetostriction.

Figure 5:
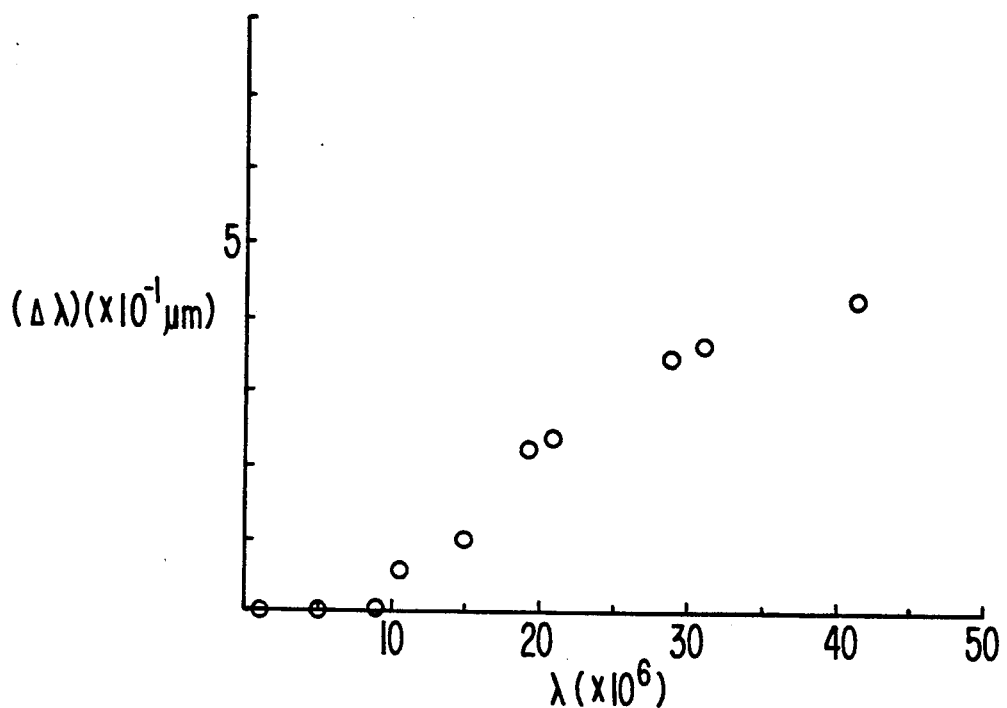
FIG. 5 is a graph indicating the relation between the magnetostriction constant $\lambda$ and the amount of variation $\Delta\lambda$ in the emitted light wavelength for an InAs semiconductor laser element, in which GaAs is used instead of InAs for the semiconductor in FIG. 6.

FIG. 5 indicates the relation between the amount of variation in the wavelength of the light emitted by a semiconductor laser, when it is measured without magnetic field and in a magnetic field of 50 Oe, and the magnetostriction constant λ, the semiconductor laser being fabricated by using GaAs in lieu of InAs for the semiconductor in FIG. 6 and by making magnetic materials having magnetostriction constants λ grow epitaxially in elements, in which GaAs-GaAlAs quantum well layers are epitaxially grown. The amount of variation Δλ in the wavelength has a tendency to be greater, when a material having a greater magnetostriction constant λ is used, and when a material having a magnetostriction constant above $1 \times 10^{-5}$ is used, variations in the wavelength of the light emitted by the semiconductor laser can be detected. Further, from another point of view, when the amount of variation in the lattice constant of the semiconductor is considered, if the amount of variation therein is greater than 0.01%, variations in the photocurrent and in the specific resistance due to the variations can be detected. When the variations are greater than 10%, it is feared that distortions in the semiconductor are irreversible.

Figure 7:
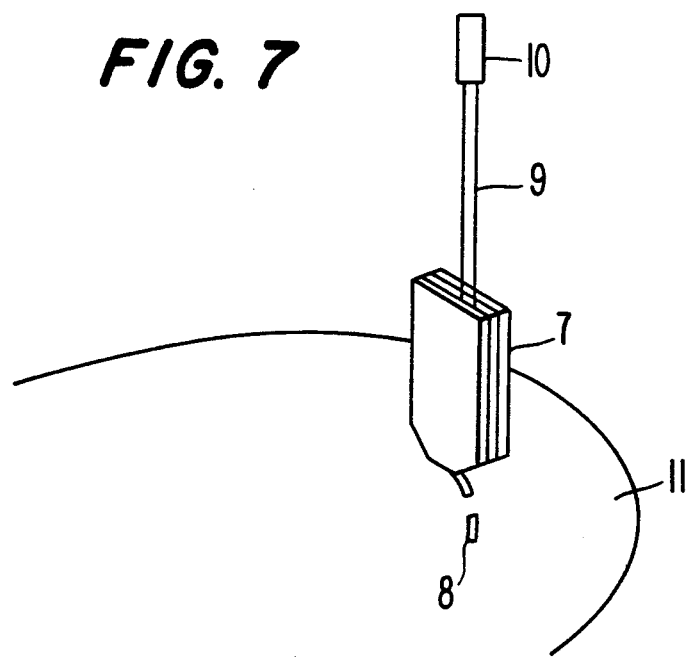
FIG. 7 is a perspective view showing the outline of a magneto-optical read out head.

As indicated in FIGS. 3 to 5, it is possible to detect variations in the magnetic field in the form of variations in the photocurrent or the wavelength of the laser light as well as in the specific resistance by means of an element using a magnetic semiconductor element. Therefore it can be applied to a magnetooptical read-out head indicated in FIG. 7. A semiconductor laser element 7 capable of being modulated by a magnetic field according to the present invention, using ferrite as a magnetostrictive material and semiconductor is fabricated by growing epitaxially the layers so that [100] of the ferrite and [110] of the semiconductor are parallel to each other. The magnetic field distribution recorded on a magnetic disk 11 in the form of bits is read out by the semiconductor laser element 7 capable of being modulated by a magnetic field according to the present invention, and the wavelength of the laser light 9 or the intensity of the photocurrent is transformed into a signal by a detector 10. As indicated in FIG. 7, the detector 10 and the semiconductor laser element 7 capable of being modulated by a magnetic field according to the present invention are not brought into contact with each other by virtue of the application of the magnetic semiconductor element. Therefore, since it can be intended to lighten the element, it is possible to deal with the high speed magnetic disk rotation and to read out information with a high speed.

Figure 10:
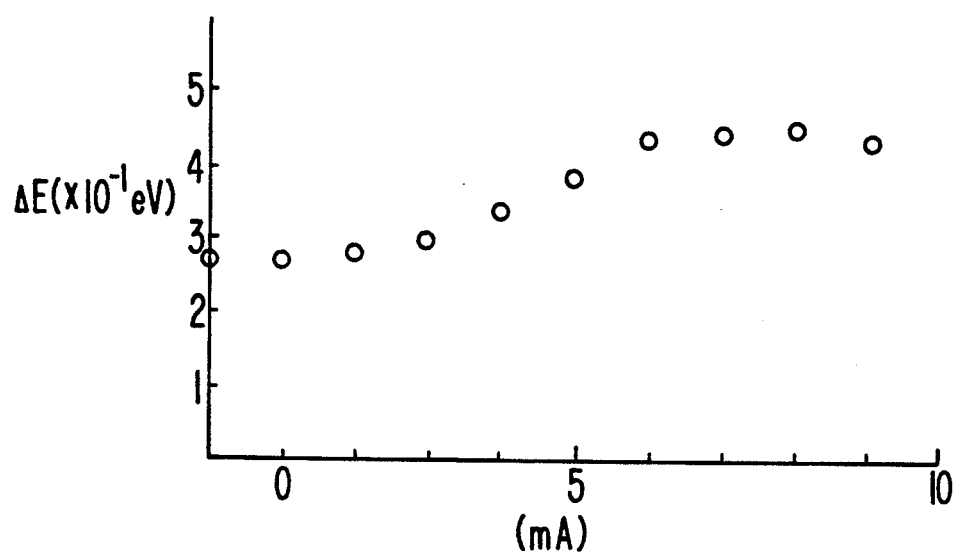
FIG. 10 is a graph indicating the relation between the beam current and the amount of variation in the band gap for a $CoFe_2O_4/$ InAs material.

In TABLE 2, the $CoFe_2O_4$ film can be epitaxially grown while injecting oxygen ions in a $CoFe_2$ film 20 μm thick during the fabrication by evaporation without introducing oxygen gas. FIG. 10 indicates the relation between the amount of variation ΔE in the band gap and the beam current for a $CoFe_2O_4$/InAs material thus fabricated. By using a beam current above 1 mA it is possible to obtain ΔE greater than that obtained by using a film deposited by evaporation in an oxygen atmosphere without using any beam. It can be thought that this is due to the fact that regular alignment of oxygen atoms is accelerated by using the beam during the growth.

According to the present invention, since it is possible to vary optical and electric characteristics of a semiconductor body having an interface with a magnetic material by magnetostriction, it can be applied in the form of a magnetic disk read-out head, etc. and it is possible to reduce the size and the weight of a high speed read-out device. Further the magnetic semiconductor element according to the present invention can be applied to magneto-optical communication.

By the fabrication method according to the present invention, since epitaxial growth is utilized, it is possible to fabricate a magnetic semiconductor element having an interface with a semiconductor body, whose lattice constant is varied by magneto-striction, in a simple manner.

We claim:

1. A semiconductor laser, comprising:
   a laminated composite which is formed of layers of a magnetostrictive material and a semiconductive material, said semiconductive material being sandwiched between the magnetostrictive materials, wherein said magnetostrictive material has an absolute value of magnetostriction constant equal to at least $1 \times 10^{-5}$, and wherein said semiconductive material can emit a laser light, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and
   ohmic electrodes for applying one of a voltage and a current to said semiconductive material.

2. A semiconductor laser according to claim 1, wherein, at an interface between said magnetostrictive material and said semiconductive material, the magnetostrictive material is oriented such that the magnetostriction constant is at least $1 \times 10^{-5}$ in a direction in which a lattice constant of the semiconductive material varies.

3. A semiconductor laser, comprising:
   a laminated composite which is formed of layers of a magnetostrictive material and a semiconductive material, said semiconductive material being sandwiched between said magnetostrictive materials, wherein said magnetostrictive material contains at least one selected from the group consisting of Fe, Co and Ni, and has an absolute value of the magnetostriction constant equal to at least $1 \times 10^{-5}$, and wherein said semiconductive material can emit a laser light, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and
   ohmic electrodes for applying one of a voltage and a current to said semiconductive material.

4. A semiconductor laser according to claim 3, wherein, at an interface between said magnetostrictive material and said semiconductive material, the magnetostrictive material is oriented such that the magnetostriction constant is at least $1 \times 10^{-5}$ in a direction in which a lattice constant of the semiconductive material varies.

5. A semiconductor laser according to claim 3, wherein said magnetostrictive material contains an oxide of said at least one selected from the group consisting of Fe, Co and Ni.

6. A semiconductor laser, comprising:

a laminated composite which is formed of layers of a magnetostrictive material and a semiconductive material, said semiconductive material being sandwiched between said magnetostrictive materials, wherein said magnetostrictive material is an oxide containing at least one selected from the group consisting of Fe, Co and Ni, and has an absolute value of the magnetostriction constant equal to at least $1\times10^{-5}$, and wherein said semiconductive material can emit a laser light, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and ohmic electrodes for applying one of a voltage and a current to said semiconductive material.

7. A semiconductor laser, comprising:

a laminated composite which is formed of layers of a magnetostrictive material and a semiconductive material, said semiconductive material being sandwiched between said magnetostrictive materials, wherein said magnetostrictive material contains at least one selected from the group consisting of Fe, Co and Ni, and has an absolute value of the magnetostriction constant equal to at least $1\times10^{-5}$, and wherein said semiconductive material can emit laser light and the lattice constant thereof is variable, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and ohmic electrodes for applying one of a voltage and a current to said semiconductive material.

8. A semiconductor laser according to claim 7, wherein said magnetostrictive material contains an oxide of said at least one selected from the group consisting of Fe, Co and Ni.

9. A semiconductor laser according to claim 7, in which the amount of variation in the lattice constant of the semiconductive material is 0.01–10%.

10. A semiconductor laser, comprising:

a laminated composite which is formed of layers of a magnetostrictive material and a semiconductive material, said semiconductive material being sandwiched between said magnetostrictive material, wherein said magnetostrictive material contains at least one selected from the group consisting of Fe, Co and Ni, and has an absolute value of magnetostriction constant equal to at least $1\times10^{-5}$, and wherein said semiconductive material can emit laser light and a specific resistance thereof is variable, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and ohmic electrodes for applying one of a voltage and a current to said semiconductive material.

11. A semiconductor laser according to claim 10, wherein said magnetostrictive material contains an oxide of said at least one selected from the group consisting of Fe, Co and Ni.

12. A semiconductor laser, comprising:

a laminated composite which is formed of layers of a magnetostrictive material and a semiconductive material, said semiconductive material being sandwiched between said magnetostrictive material, wherein said magnetostrictive material contains at least one selected from the group consisting of Fe, Co and Ni, and has an absolute value of the magnetostriction constant equal to at least $1\times10^{-5}$, and wherein said semiconductive material can emit laser light and a layer thereof is formed by epitaxial growth, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and ohmic electrodes for applying one of a voltage and a current to said semiconductive material.

13. A semiconductor laser according to claim 12, wherein said magnetostrictive material contains an oxide of said at least one selected from the group consisting of Fe, Co and Ni.

14. A semiconductor laser, comprising:

a laminated composite which is formed of layers of a magnetostrictive material and a semiconductive material, the semiconductive material being sandwiched between said magnetostrictive material, wherein said magnetostrictive material contains at least one selected from the group consisting of Fe, Co and Ni, and has an absolute value of the magnetostriction constant equal to at least $1\times10^{-5}$, and wherein said semiconductive material forms an interface with said magnetostrictive material and can emit a laser light, the magnetostrictive material being joined to the semiconductive material such that one of (a) resistance of the semiconductive material, and (b) one of the wavelength and intensity of the laser light emitted from the semiconductive material, is varied by variations in an external magnetic field applied to the magnetostrictive material; and ohmic electrodes for applying one of a voltage and a current to said semiconductive material.

15. A semiconductor laser according to claim 14, wherein said magnetostrictive material contains an oxide of said at least one selected from the group consisting of Fe, Co and Ni.

16. A semiconductor laser, comprising:

n-type semiconductive material formed on a substrate;

a first magnetostrictive material which is formed on said n-type semiconductive material and contains at least one selected from the group consisting of Fe, Co and Ni, and has an absolute value of the magnetostriction constant equal to at least $1\times10^{-5}$;

a quantum well layer which is formed on said first magnetostrictive material and can emit laser light;

a second magnetostrictive material formed on said quantum well layer, which contains at least one selected from the group consisting of Fe, Co and Ni, and which has an absolute value of the magnetostriction constant equal to at least $1 \times 10^{-5}$;

p-type semiconductive material formed on said second magnetostrictive material; and ohmic electrodes for applying one of a voltage and a current between said n-type and said p-type semiconductive material;

wherein the first and second magnetostrictive materials are joined to the quantum well layer such that one of the wavelength and intensity of said laser light which is emitted by said quantum well layer can be varied by variations in external magnetic field applied to the first and second magnetostrictive materials.

17. A semiconductor laser according to claim 16, wherein said first and second magnetostrictive materials contain an oxide of said at least one selected from the group consisting of Fe, Co and Ni.

18. A magnetic head for reading out information, comprising:

a semiconductor laser having a laminated composite formed of layers of a magnetostrictive material and a semiconductive material, and ohmic electrodes for applying one of a voltage and a current to said semiconductive material, wherein said magnetostrictive material contains at least one selected from the group consisting of Fe, Co and Ni, and has an absolute value of the magnetostriction constant equal to at least $1 \times 10^{-5}$, and wherein said semiconductive material can emit a laser light; and a detector for converting one of wavelength and intensity of a laser light which is emitted from said semiconductive laser to a signal according to a magnetic field in a magnetic disc recorded with magnetic information.

19. A magnetic head according to claim 18, wherein said magnetostrictive material contains an oxide of said at least one selected from the group consisting of Fe, Co and Ni.

20. A magnetic disc apparatus, comprising:

a magnetic disc recorded with magnetic information;

a semiconductor laser having a laminated composite formed of layers of a magnetostrictive material and a semiconductive material, and ohmic electrodes for applying one of a voltage and a current to said semiconductive material, wherein said magnetostrictive material contains at least one selected from the group consisting of Fe, Co and Ni, and has an absolute value of the magnetostriction constant equal to at least $1 \times 10^{-5}$, and wherein said semiconductive material can emit a laser light; and a magnetic head for reading out information, the magnetic head including a detector for converting one of wavelength and intensity of a laser light, which is emitted by said semiconductive laser, to a signal according to variations of a magnetic field in said magnetic disc.

21. A semiconductor laser according to claim 20, wherein said magnetostrictive material contains an oxide of said at least one selected from the group consisting of Fe, Co and Ni.

22. A semiconductor laser, comprising:

a laminated composite which is formed of layers of a magnetostrictive material and a semiconductive material, wherein said magnetostrictive material contains at least one selected from the group consisting of Fe, Co and Ni, and wherein said semiconductive material can emit laser light, the magnetostrictive material being joined to the semiconductive material such that one of the wavelength and intensity of the laser light emitted from the semiconductive material is varied by variations in an external magnetic field applied to the magnetostrictive material; and ohmic electrodes for applying one of a voltage and a current to said semiconductive material.

23. A semiconductor laser according to claim 22, wherein said magnetostrictive material contains an oxide of said at least one selected from the group consisting of Fe, Co and Ni.

24. A semiconductor laser, comprising:

a laminated composite which is formed of layers of a magnetostrictive material and a semiconductive material, wherein said semiconductive material can emit laser light, and wherein the magnetostrictive material has a sufficiently large magnetostriction constant, and is so joined to the semiconductive material, such that one of the wavelength and intensity of the laser light emitted from the semiconductive material is varied by variations in an external magnetic field applied to the magnetostrictive material; and ohmic electrodes for applying one of a voltage and a current to said semiconductive material.

* * * * *